United States Patent [19]

Georgiou et al.

[11] Patent Number: 4,692,349
[45] Date of Patent: Sep. 8, 1987

[54] SELECTIVE ELECTROLESS PLATING OF VIAS IN VLSI DEVICES

[75] Inventors: George E. Georgiou, Gillette; Gary N. Poli, High Bridge, both of N.J.

[73] Assignee: American Telephone and Telegraph Company, AT&T Bell Laboratories, Murray Hill, N.J.

[21] Appl. No.: 835,355

[22] Filed: Mar. 3, 1986

[51] Int. Cl.[4] ............................................. C23C 18/34
[52] U.S. Cl. ................................. 437/230; 427/305; 437/236
[58] Field of Search ............................ 427/92, 90, 305

[56] References Cited

U.S. PATENT DOCUMENTS

| 4,182,781 | 1/1980 | Hooper | 427/92 |
| 4,297,393 | 10/1981 | Denning | 427/92 |
| 4,419,390 | 12/1983 | Feldstein | 427/92 |
| 4,542,074 | 9/1985 | Sirinyan | 427/92 |

FOREIGN PATENT DOCUMENTS

| 51-32064 | 9/1976 | Japan | 427/92 |
| 53-52080 | 5/1978 | Japan | 427/92 |

OTHER PUBLICATIONS

Coleman et al., "The Pd$_2$Si-(Pd)-Ni-Solder Plated Metallization for Silicon Solar Cells" Conference, 13th IEEE Photovoltacic-Specialists Conference, Washington, D.C. (Jun. 5–8, 1978), pp. 597–602.

Primary Examiner—John D. Smith
Attorney, Agent, or Firm—Lucian C. Canepa

[57] ABSTRACT

Selective electroless plating of cobalt or nickel is utilized to form conductive plugs in high-aspect-ratio vias in VLSI devices. Particularly good results are obtained when an active or catalytic film is formed on the via bottoms to serve as a plating base.

5 Claims, 4 Drawing Figures

SELECTIVE ELECTROLESS PLATING OF VIAS IN VLSI DEVICES

BACKGROUND OF THE INVENTION

This invention relates to microminiature integrated-circuit devices and, more particularly, to a method for forming conductive plugs in vias in very-large-scale-integrated (VLSI) devices.

The problem of conductively filling vias in dielectric layers of VLSI devices is frequently an extremely difficult one. This is especially so if the vias have vertical or near-vertical walls and an aspect (or height-to-diameter) ratio that exceeds unity. For such vias, conventional techniques such as sputtering of aluminum typically exhibit poor step-coverage and/or other properties which make them unsatisfactory in practice for inclusion in fabrication sequences for making VLSI devices.

Accordingly, workers in the art have directed considerable efforts at trying to devise improved ways of conductively filling vias. It was recognized that these efforts if successful could be an important factor in improving the yield and lowering the cost of VLSI devices.

SUMMARY OF THE INVENTION

Hence, an object of the present invention is an improved method of making integrated-circuit devices. More specifically, an object of this invention is an improved method of conductivity filling high-aspect-ratio vias in VLSI devices.

Briefly, these and other objects of the present invention are realized in a specific illustrative electroless plating method in which a conductive metal is formed in vias in a VLSI device. In accordance with a feature of this invention, each via to be plated is designed to have a layer of an active material at the bottom thereof. Subsequently, a plug of cobalt or nickel is selectively wet plated in an electroless manner in the vias on top of the active layer. During the plating operation, no cobalt or nickel forms on exposed dielectric surfaces of the device.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
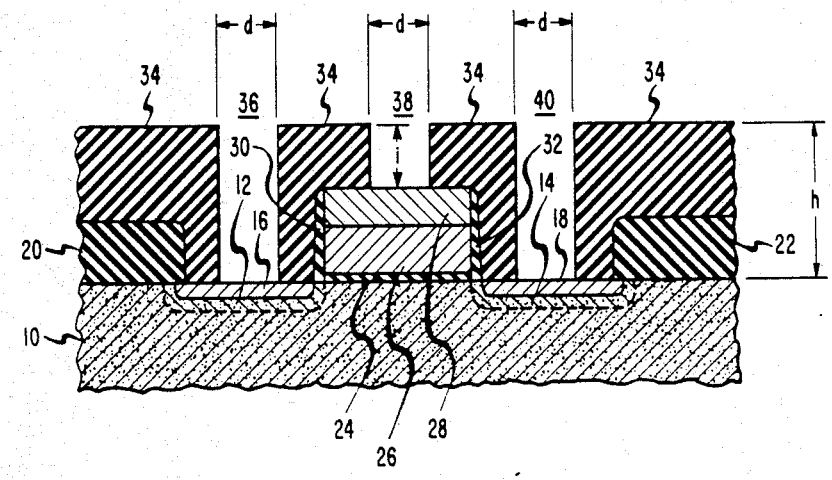
FIG. 1 is a cross-sectional depiction of a known VLSI device of the type to which the principles of the present invention are illustratively applicable.

By way of example, FIG. 1 shows a portion of a conventional VLSI device of the metal-oxide-semiconductor (MOS) type. The depicted device comprises a silicon substrate 10 having diffused source and drain regions 12 and 14 and metallic silicide contacts 16 and 18 formed therein. Field-oxide portions 20 and 22 and gate-oxide portion 24 are disposed on the substrate 10. A composite gate electrode comprising a doped polysilicon element 26 and a metallic silicide element 28 overlies the gate-oxide portion 24. Illustratively, the contacts 16 and 18 are each made of cobalt silicide and the element 28 is made of tantalum silicide. Additionally, sidewalls 30 and 32 made of a suitable dielectric material, such as the material that is formed in a standard chemical vapor deposition step from a source comprising tetraethylorthosilicate and triethyl phosphite, are disposed on the sides of the depicted gate structure. The resulting conventional material formed on the sidewalls is commonly referred to as PTEOS glass. Finally, FIG. 1 shows a patterned dielectric layer 34 made, for example, of PTEOS overlying the aforedescribed structure.

The patterned dielectric layer 34 of FIG. 1 includes three vias 36, 38 and 40 formed therein. Each of these vias is shown as having vertical walls. The vias 36 and 40 are the means by which conductive connections will subsequently be made to the contacts 16 and 18 of the source and drain regions 12 and 14 of the FIG. 1 device. Similarly, the via 38 is the means by which a conductive connection will subsequently be made to the element 28 of the composite gate electrode.

Illustratively, the height h of each of the source/drain vias 36 and 40 of the particular FIG. 1 device is approximately one micrometer ($\mu$m) and the diameter d thereof is about 0.5 $\mu$m. Thus, the height-to-diameter or aspect ratio of these vias exceeds unity. In the particular device illustrated in FIG. 1, the diameter d of the gate via 38 is also about 0.5 $\mu$m but the height i thereof is only approximately 0.5 $\mu$m. The aspect ratio of the via 38 is thus approximately unity.

In practice, it is difficult to achieve good step coverage of the vias 36 and 40 (FIG. 1) with a conductive material. Conventional deposition techniques such as sputtering of aluminum have not proven effective to form reliable metallization structures in such high-aspect-ratio vias.

In accordance with the principles of the present invention, high-aspect-ratio microminiature vias such as those shown in FIG. 1 are partially or completely filled with conductive cobalt or nickel in an electroless plating process. Applicants have found that conductive via plugs formed in accordance with their process exhibit excellent electrical and mechanical properties consistent with the requirements of high-quality VLSI devices.

In accordance with applicants' process, electroless plating is carried out by immersing a workpiece such as a semiconductor wafer in a plating bath. Surfaces of the workpiece that are not to be plated are masked with an inactive material on which plating will not occur. Thus, for example, in the case of a silicon wafer in which multiple VLSI chips are to be defined in one main planar surface thereof, the other main planar surface of the wafer would be masked during plating with a layer of dielectric material such as silicon dioxide.

During plating, conductive material builds up only on active or catalytic surfaces of the device structure being fabricated. Herein, the term active or catalytic surface means an electron-donor surface that is properly charged to attract cobalt or nickel ions of the type provided by the baths specified later below. Thus, in FIG.

2, no cobalt or nickel material plates directly on surfaces of the dielectric TEOS layer 34 during the electroless process.

Applicants have found that excellent-quality conductive plugs of cobalt or nickel can be electroless plated in VLSI devices on active surfaces made, for example, of metallic silicides such as cobalt silicide, tantalum silicide or titanium silicide. This is a significant finding because such silicides are often already included in source/drain, gate and other regions of VLSI devices. Further, applicants have found that the active surface for plating may comprise a sputtered film of cobalt, nickel, palladium, platinum or copper. Importantly, all of these materials are compatible with and often used in typical VLSI devices.

Figure 2:
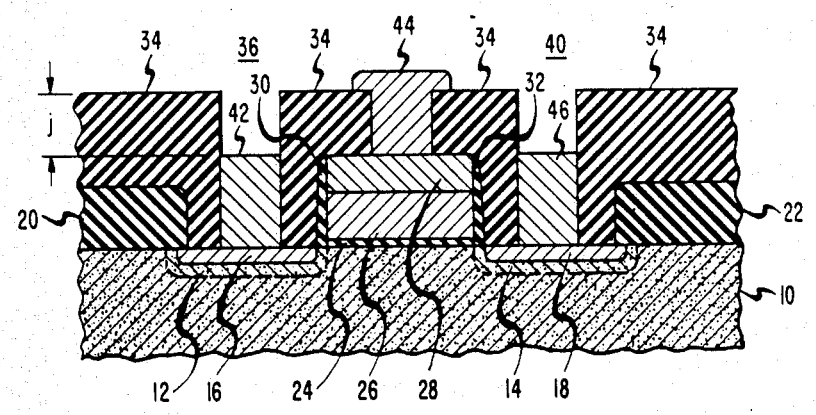
FIG. 2 shows the FIG. 1 device with the addition thereto of conductive plugs made in accordance with applicants' invention.

Thus, for example, electroless plating in accordance with applicants' inventive principles may take place directly on the surfaces of the cobalt silicide contacts 16 and 18 and the tantalum silicide element 28 shown in FIG. 2. Advantageously, these surfaces are cleaned before starting the plating process. Cleaning is done, for example, with buffered hydrofluoric acid for a relatively short period, for example about two minutes, so as not to unduly enlarge the vias. Preferably, cleaning of these surfaces is carried out in a standard back-sputtering step. By either cleaning technique, residues such as oxides of cobalt, tantalum and silicon are removed from the surfaces to be plated.

Electroless plating of cobalt or nickel directly on a silicon surface is generally not feasible for VLSI device fabrication. Plugs plated directly on silicon have been determined, for example, to exhibit poor adhesion to the underlying surface.

In accordance with the principles of the present invention, electroless plating of cobalt (actually about 95 percent cobalt, 2 percent nickel and 3 percent phosphorus) is carried out from a water-based solution comprising a sodium-free bath at about 90 degrees Celsius. The approximate composition of the bath is, for example: 60 grams per liter of $CoSO_4$, 2 grams per liter of $NiSO_4$, 42 grams per liter of $NH_4SO_4$, 55 grams per liter of $(NH_4)HC_6H_5O_7$ and 8 milliliters per liter of $HPH_2O_2$ with the pH of the solution being adjusted to a value of about 8.5 with $NH_4OH$. The plating rate on cobalt and tantalum silicide is about 900 Angstrom units (Å) per minute. No cobalt plating occurs on dielectric surfaces of the device structure. The chemical reaction that occurs during cobalt plating involves essentially hypophosphite reduction of a metal source of hydrogen evolution.

In further accordance with the principles of this invention, electroless plating of nickel (actually about 95 percent nickel and 5 percent phosphorus) is carried out from a water-based solution also comprising a sodium-free bath at about 90 degrees Celsius. Illustratively, the approximate composition of the bath is: 25 grams per liter $NiSO_4$, 60 grams per liter $(NH_4)_2 HC_6H_5O_7$, 50 grams per liter $NH_4Cl$ and 10 grams per liter $NH_4 H_2PO_2$, with the pH of the solution being adjusted to a value of about 9 with $NH_4OH$. The plating rate on cobalt silicide and tantalum silicide is about 800 Å per minute. No nickel plating occurs on dielectric surfaces of the device structure. As before, the chemical reaction that occurs during nickel plating also involves essentially hypophosphite reduction of a metal source with hydrogen evolution.

In the particular illustrative device structure of FIG. 2, the electroless-plated cobalt or nickel plugs that are formed in the vias 36, 38 and 40 are designated 42, 44 and 46, respectively. Due to the height differences among the three indicated vias, the plugs 42 and 46 only partially fill the vias 36 and 40 whereas the plug 44 actually overfills the gate via 38. Any additional plating would cause the portions of the plug 44 on top of the layer 34 to further extend laterally beyond prescribed limits dictated by the particular device design.

Even though the conductive plugs 42 and 46 shown in the particular device structure of FIG. 2 do not fill their respective vias, the plugs 42 and 46 are effective to significantly reduce the aspect ratios of the vias 36 and 40. In one particular illustrative device structure, the height i from the tops of the plugs 42 and 46 to the top surface of the layer 34 was only about 0.5 μm after plating. Thus, the aspect ratios of these partially filled vias were substantially reduced, specifically, to a value of about unity. As a result, metallization of the vias 36 and 40 can then be effectively completed in a subsequent conventional step by, for example, sputtering aluminum on the entire top surface of the device structure depicted in FIG. 2.

Of course, the design of other device structures to which applicants' inventive principles are applicable may be such that the source/drain vias are completely filled by electroless plating of the type specified herein. In those cases, an advantageous planar surface is provided for subsequent metallization.

Figure 3:
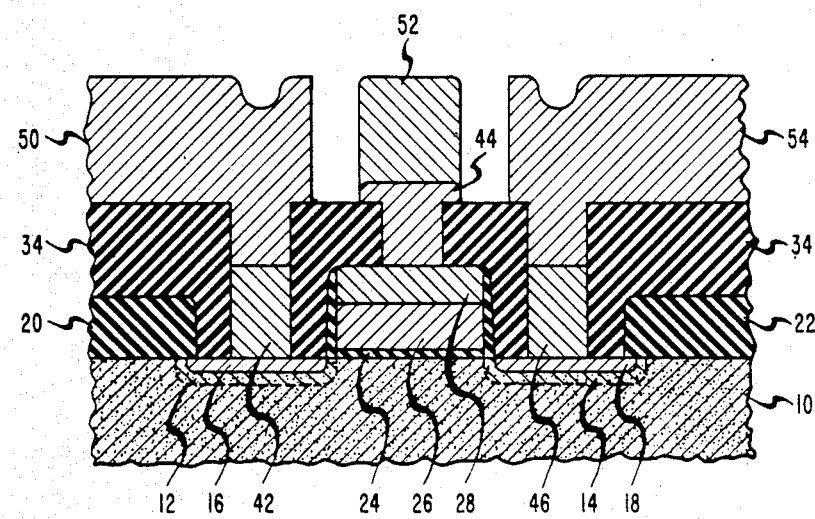
FIG. 3 depicts the FIG. 2 device with the addition thereto of an overlying conductive pattern.

FIG. 3 shows an aluminum layer after it has been applied to the entire top surface of FIG. 2 and then patterned in any one of a number of standard ways. One portion 50 of the patterned aluminum layer makes contact with the source/drain plug 42. Another aluminum portion 52 contacts the gate plug 44. And yet another portion 54 contacts the source/drain plug 46.

Near-noble metals such as cobalt and nickel interact with silicon and aluminum at temperatures in the approximate range of 400-to-450 degrees Celsius. Thus, care must be taken in device structures of the type shown in FIG. 3 to maintain processing temperatures low enough to avoid deleterious effects on the source/drain junctions therein. In particular, high-temperature processing in such devices can cause vertically extending interactions that result in unacceptably high leakage of shallow junctions.

In accordance with the principles of the present invention, electroless-plated via plugs comprising cobalt or nickel are useful in integrated-circuit devices for various purposes. In some device structures in which plated plugs are employed, a relatively thick layer underlies each plated plug. In such devices, high-temperature-caused interactions between the material of the plug and silicon or aluminum layers may not have a damaging effect on device performance. Illustrative examples of such devices will be specified below in connection with FIG. 4.

Figure 4:
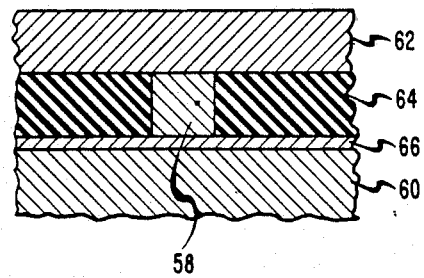
FIG. 4 is a schematic cross-sectional representation of a portion of another VLSI device that includes a conductive plug made in accordance with aplicants' invention.

FIG. 4 illustrates the use of an electroless plated via plug 58 made in accordance with this invention employed to interconnect conductive layers 60 and 62 which are separated by dielectric layer 64. By way of example, the layer 60 is about 1 μm high, the layer 62 is approximately 1 μm high and each of the layers 60 and 62 is made of aluminum. Illustratively, the layer 64 is made of glass or a suitable polymer such as Pyralin.

In FIG. 4, the via filled with the plug 58 is of the aforespecified high-aspect-ratio type to which applicants' inventive principles are partially applicable.

In accordance with the principles of the present invention, electroless plating of cobalt or nickel in a FIG.

4-type structure is advantageously carried out on a clean active surface made of a material such as, for example, cobalt, nickel, palladium, platinum or copper. FIG. 4 shows a thin layer 66 of such a material interposed between the layers 60 and 64. Illustratively, the layer 66 comprises a layer of cobalt approximately 500 Å thick.

Before forming the active layer 66 (FIG. 4) on the top surface of the layer 60, it is usually necessary to clean that top surface. This is particularly important if the layer 60 is made of aluminum and has a thin film of aluminum oxide on its surface. Cleaning is carried out, for example, in a conventional back-sputtering step in which typically only about 100 Å of the surface of the layer 60 is removed. The layer 66 is then formed on the surface of the cleaned layer 60 by, for example, standard sputter deposition.

Subsequently, the patterned layer 64 of FIG. 4 is formed overlying the layer 66. Vias in the layer 64 are then plugged by utilizing either of the electroless plating processes described earlier above. During the selective plating process, no cobalt or nickel adheres to the top surface of the dielectric layer 64. Advantageously, plating is continued until the top surfaces of the plug 58 and of any other plugs in the device structure lie approximately in the same plane as the top surface of the layer 64. Providing such a planar surface in the structure facilitates subsequent deposition of the overlying conductive layer 62.

The cross-sectional depiction of FIG. 4 is also representative of a portion of a device structure in which the patterned layer 64 is made of a dielectric material such as PTEOS, the layer 62 is made of a conductive material such as aluminum and the layer 60 is made of polysilicon that is sufficiently doped to render it conductive. On one such practical device structure, the height of the doped polysilicon layer 60 is about 4000 Å and a 1000-Å-high layer 66 of a metallic silicide such as cobalt silicide is formed on the layer 60. Such a cobalt silicide layer serves, for example, as part of a composite gate electrode in other portions (not shown) of the structure. Moreover, the regions of the cobalt silicide layer 66 that lie at the respective bottoms of the vias formed in the dielectric layer 64 serve as excellent bases on which to electroless plate cobalt or nickel in accordance with the inventive teachings specified herein.

In a FIG. 4-type device structure in which the layer 60 comprises doped polysilicon, interactions between the cobalt or nickel material of the plated plug 58 and the underlying polysilicon of the layer 60 will inevitably occur as processing temperatures are raised. But even at a temperature of approximately 450 degrees Celsius, the interactions between cobalt and the underlying polysilicon will usually not extend vertically more than about 5000 Å. And, since the aforespecified layer 60 is about 4000 Å high, such interactions between the plug 58 and the underlying polysilicon will typically not cause any harmful effects in the device structure.

Electroless-plated plugs made in accordance with the principles of the present invention have been determined to exhibit a variety of advantageous properties that make them appear attractive as inter-level conductors in integrated-circuit devices. These properties include satisfactory adhesion to underlying active surfaces, good robustness during handling and device operation, acceptably conformal and uniform build-up during plating, and adequate conductance.

Finally, it is to be understood that the abovedescribed techniques and structures are only illustrative of the practice and applicability of the principles of the present invention. In accordance with these principles, numerous modifications and alternatives may be devised by those skilled in the art without departing from the spirit and scope of the invention. Thus, for example, in some cases aluminum itself, if properly cleaned to remove any oxide film therefrom, may serve as the active material on which to directly plate nickel. In practice, such oxide removal often necessarily entails feature enlargement or material thinning. But where such enlargement or thinning is acceptable, aluminum itself may serve as a satisfactory active layer for plating nickel. (If a plated plug of cobalt is desired, a layer of nickel on aluminum is first formed and then cobalt is plated over the nickel layer.) Aluminum cleaning is carried out, for example, by utilizing a standard wet chemical agent such as $NH_4OH$. In such cases, the use of a separate thin layer, such as the layer 66 shown in FIG. 4, is not required when interconnecting aluminum layer 60 to conductive layer 62 by means of the plated via plug 58.

Additionally, although emphasis above was directed to two particular baths suitable for plating cobalt and nickel, it is to be understood that other baths are also available to carry out applicants' inventive process. Thus, for example, it has been found that selective electroless plating may also be carried out by utilizing a bath whose pH is adjusted to a value in the approximate range of 4-to-6. Illustratively, electroless plating of nickel may be carried out from a water-based solution at a temperature of about 80 degrees Celsius, including approximately 30 grams per liter of $NiSO_4$, 3 grams per liter of $NaH_2PO_2$, 2.5 grams per liter of $CH_3COONa$ and 10 grams per liter of $H_3BO_3$, with the pH of the bath being adjusted to a value approximately between 4 and 6 by adding $H_2SO_4$ or $NH_4OH$ as conditions require. In this bath, sodium may be replaced with ammonia while maintaining the molar concentrations of the active constituents as specified above.

What is claimed is:

1. A selective electroless plating method of forming microminiature conductive plugs in high-aspect-ratio vias defined in a dielectric layer disposed on one main planar surface of a wafer in which integrated-circuit devices are to be fabricated, at least one of said vias having at the bottom thereof an active layer comprising a material selected from the group consisting of tantalum silicide and titanium silicide, said method comprising the step of immersing said wafer in a plating bath comprising a metallic source that provides ions selected from the group consisting of cobalt and nickel.

2. A method as in claim 1 wherein said method comprises the further step of forming a patterned conductive layer overlying and in contact with said plated plugs.

3. A method as in claim 2 wherein said conductive layer comprises aluminum.

4. A method as in claim 3 wherein at least some portion of said metallic silicide overlies source/drain regions of said devices.

5. A method as in claim 4 wherein at least some portion of said metallic silicide overlie doped polysilicon regions of said devices.

* * * * *